United States Patent [19]

Silvestre de Ferron

[11] Patent Number: 5,515,328
[45] Date of Patent: May 7, 1996

[54] MEMORY CIRCUIT WITH ELEMENT FOR THE MEMORIZING OF WORD LINE SELECTION FOR AN ERASURE OF A BLOCK OF INFORMATION

[75] Inventor: Gérard Silvestre de Ferron, Fuveau, France

[73] Assignee: SGS-Thomson Microelectronics, S.A., France

[21] Appl. No.: 122,315

[22] Filed: Sep. 16, 1993

Related U.S. Application Data

[63] Continuation of Ser. No. 663,716, Mar. 4, 1991, abandoned.

[30] Foreign Application Priority Data

Mar. 5, 1990 [FR] France ................... 90 02736

[51] Int. Cl.$^6$ ..................................... G11C 8/00
[52] U.S. Cl. ....................... 365/230.03; 365/218
[58] Field of Search ................... 365/218, 900, 365/230.03

[56] References Cited

U.S. PATENT DOCUMENTS

| | | | |
|---|---|---|---|
| 4,835,423 | 5/1989 | de Ferron et al. ...................... | 307/584 |
| 4,837,742 | 6/1989 | Silvestre de Ferron ................ | 365/185 |
| 4,851,894 | 7/1989 | de Ferron et al. ...................... | 357/51 |
| 4,947,378 | 8/1990 | Jinbo et al. ............................. | 365/218 |
| 4,970,692 | 11/1990 | Ali et al. ................................. | 365/218 |

FOREIGN PATENT DOCUMENTS

| | | | |
|---|---|---|---|
| 0189433 | 10/1984 | Japan ..................................... | 365/218 |
| 0018596 | 1/1988 | Japan ..................................... | 365/218 |
| 0298600 | 12/1989 | Japan ..................................... | 365/218 |
| 8202274 | 7/1982 | WIPO .................................... | 365/218 |
| 8301148 | 3/1983 | WIPO . | |

OTHER PUBLICATIONS

W. E. Proebster et al, "High–Speed Chip Card Reading", *IBM Technical Disclosure Bulletin*, vol. 27, No. 4B, Sep. 1984, pp. 2439–2441.

Patent Abstracts of Japan, vol. 10, No. 30 (P–426) (2087), Feb. 5, 1986.

*Primary Examiner*—Terry Cunningham
*Attorney, Agent, or Firm*—Robert Groover; Betty Formby

[57] ABSTRACT

In a memory circuit, the word line decoder includes a memorization logic circuit that provides for the memorizing of the selection of the word lines. This memorization provides for the simultaneous erasure of all the words lines for which the selection has been memorized.

32 Claims, 3 Drawing Sheets

MEMORY CIRCUIT WITH ELEMENT FOR THE MEMORIZING OF WORD LINE SELECTION FOR AN ERASURE OF A BLOCK OF INFORMATION

This is a continuation of application Ser. No. 07/663,716, filed Mar. 4, 1991 now abandoned.

BACKGROUND OF THE INVENTION

1. Field of the Invention

The invention relates to an electrically erasable and programmable memory (EEPROM, flash EPROM) with a block erasure mode. It can be applied to memory circuits and, more generally, to any integrated circuit having memory.

A mode of erasure in blocks (or block erasure mode) of this type is defined as the simultaneous erasure of the memory cells of several previously selected word lines. These selected word lines define a "block" of memorized information.

2. Description of the Prior Art

It may be recalled that there are essentially three types of erasable and programmable memories:

- the EPROMs (erasable programmable memories) with a total erasure of the memory by exposure to ultraviolet rays; it is therefore not possible to erase only a zone or a particular block of the memory.
- the EEPROMs (electrically erasable programmable memories) with sequential electrical erasure. Depending on the organization of the memory, for example in eight-bit words, it is possible to erase an information block, sequentially, by the erasure of the word of a selected word line. Thus, to erase a four-word block, it is necessary to select the first word line, erase its eight memory cells, then do same with the second word line, and so on until the fourth word line.
- the flash EPROMs with sequential electrical erasure (of the entire memory). There are also flash EPROMs with sequential electrical erasure by word line, as in the EEPROMs.

The EEPROMs and flash EPROMs therefore provide for erasure by blocks, but sequentially: each word line is erased successively. This mechanism is hence very slow since, for a block of n word lines, there are n line selections and n erasures, given moreover that it is the operation of erasure that is decisive in the total time needed for the erasure of a block. For example, the selection of a line requires 250 ns and the erasure of this line requires 1 s.

SUMMARY OF THE INVENTION

The aim of the invention is to provide for the simultaneous erasure of all the lines of a block that has to be erased: we thus have a single erasing operation, whence a drastic reduction in the time taken to erase a block of the memory, as compared with the techniques used hitherto for the electrically erasable and programmable memories.

In a known way, the word lines are selected by the decoding of the address lines of the memory. To simplify matters, let us assume that the memory has a capacity of four bytes (that is, four eight-bit words). There are four word lines to be addressed, LM0 to LM3. This necessitates two address lines a0, a1. A circuit for the decoding of the two address lines therefore has the four word lines LM0 to LM3 at output.

If a selection of a word line is characterized by a low state on this line, there will be, for example, the following decoding logic equations:

/LM0=/a0./a1

/LM1=a0./a1

/LM2=/a0.a1

/LM3=a0.a1

The corresponding operating table is:

| a1 | a0 | selection |
|----|----|-----------|
| 0  | 0  | LM0       |
| 0  | 1  | LM1       |
| 1  | 0  | LM2       |
| 1  | 1  | LM3       |

(the symbol "/" signifies the logic complement).

These equations are easy to implement, for example by means of inverters and NAND gates.

An object of the invention is to memorize the selection of the word lines by the introduction, between the address lines and the word lines, of a memorizing element. Advantageously, this memorization cannot be enabled unless the memory is in a block erasure mode.

An object of the invention, therefore, is a memory circuit for an electrically erasable and programmable memory including a word line decoder, the decoder consisting of a first logic circuit for obtaining the address bits of the word lines and of their logic complements, and including a second logic circuit for the decoding of the address bits and of their logic complements to select a word line and deliver selection signals, wherein said circuit further includes a logic circuit for the memorization of word line addressing, providing for the memorizing of the addressing of the word lines prior to a simultaneous erasure of the word lines for which the addressing has been memorized.

BRIEF DESCRIPTION OF THE DRAWINGS

Other characteristics and advantages of the present invention will be understood more clearly from the description made with reference to the appended drawings. This description is given purely by way of indication and in no way restricts the scope of the invention.

Of these appended figures.

DESCRIPTION OF PREFERRED EMBODIMENTS

Figure 1:
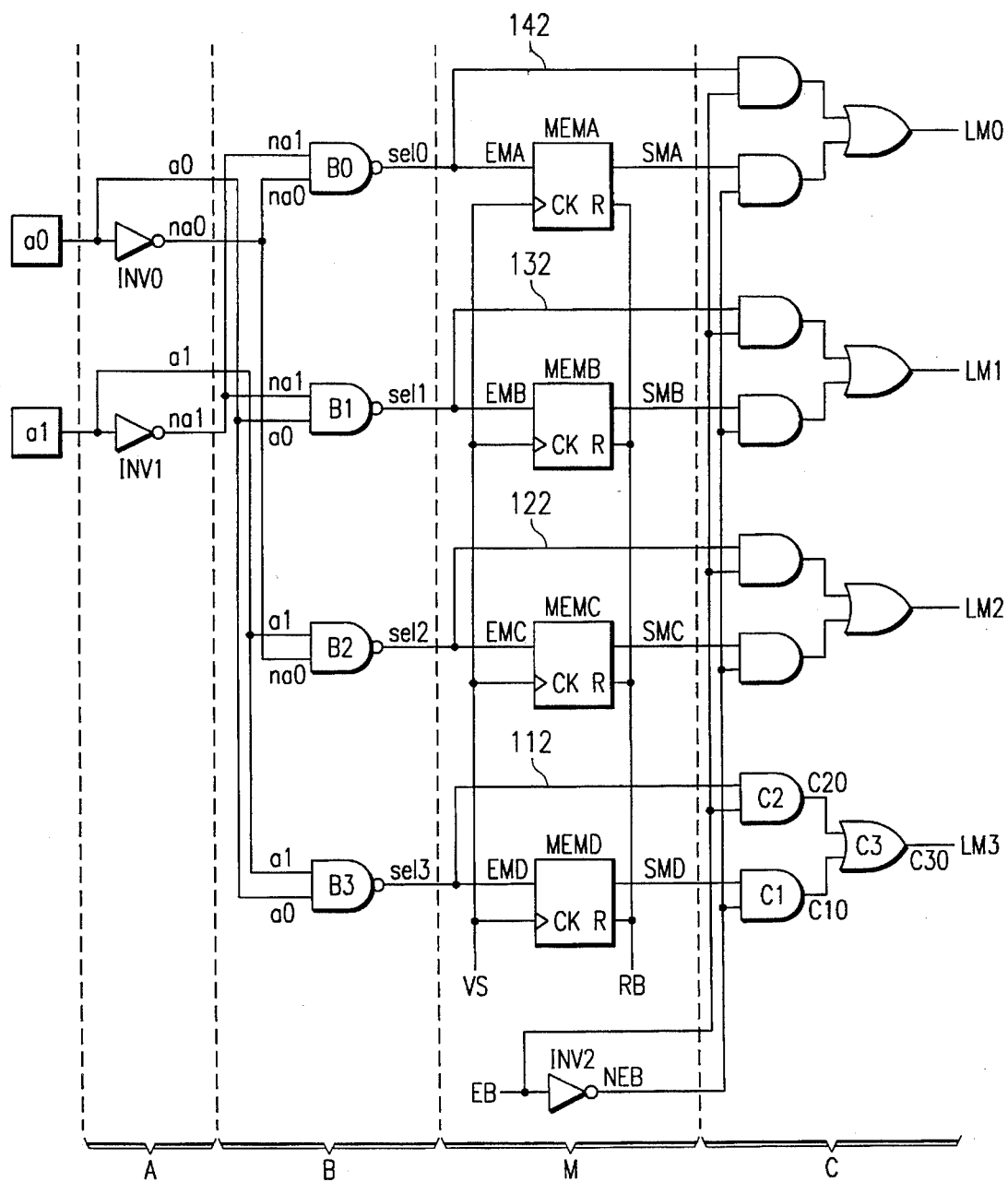
FIG. 1 is an electrical diagram of a word line decoder with a memorization element according to a first embodiment of the invention.

FIG. 1 shows a decoder according to a first embodiment of the invention. To simplify the description, this example uses a memory with four word lines LM0 to LM3 and, hence, with two address bits a0 and a1.

A first logic circuit A of the decoder is used to obtain the complements na0, na1 of the address bits a0 and a1, in using an inverter INV0, INV1 for each address bit a0, a1.

A second logic circuit B of the decoder uses the address bits a0, a1 and their complements na0, na1, to decode the address and select the corresponding word line. In the example, this circuit is made up of four NAND gates: B0 to B3 which implement the following four equations:

- decoding of the address 0 (a0 = 0, na0 = 1, a1 = 0, na1 = 1):
  sel0 = NAND(na0, na1)
- decoding of the address 1 (a0 = 1, na0 = 0; a1 = 0, na1 = 1):
  sel1 = NAND(a0, na1)
- decoding of the address 2 (a0 = 0, na0 = 1; a1 = 1, na1 = 0):
  sel2 = NAND(na0, a1)
- decoding of the address 3 (a0 = 1, na0 = 0; a1 = 1, na1 = 0):
  sel3 = NAND(a0, a1)

sel0, sel1, sel2 and sel3 are the respective outputs of the gates B0, B1, B2, B3 which respectively correspond to the selection of the word lines LM0, LM1, LM2 and LM3. These are active-low signals: it is when the level of sel0 is at 0 that the word line LM0 is said to be selected.

In a first embodiment of the invention, a memorization logic circuit M is placed after the logic circuit B: a memorization element is placed in series, after each of the outputs of the NAND gates of the logic circuit B. Thus, the signals sel0, sel1, sel2 and sel3 are respectively an input EMA, EMB, EMC and EMD of the memory elements MEMA, MEMB, MEMC and MEMD. Each memorization element further receives a clock input CK given, in the example, by a selection enabling signal VS common to all the memory elements MEMA to MEMD, and a reset input R, given in the example by a block reset signal RB, common to all the memory elements MEMA to MEMD. Each memorization element delivers an output, SMA to SMD.

Each memorization element, for example MEMA, works as follows:

upon an activation of the reset signal R, the output SMA goes to the state 1, irrespectively of the states of the clock CK and of the input EMA;

when the output SMA is in the state 1, at each clock signal, the state of the output SMA changes if the state of the input EMA is 1, and does not change if the state of the input EMA is 0;

if the output SMA is gone to 0, it remains in this state for as long as there is no activation of the reset signal R.

This operation can be represented by the following logic table:

| CK | R | EMA | SMA | SMA |
|----|---|-----|-----|-----|
| X  | 1 | X   | X   | 1   |
| 1  | 0 | 1   | 1   | 1   |
| 1  | 0 | 0   | 1   | 0   |
| 1  | 0 | 0/1 | 0   | 0   |

An operation such as this can be easily carried out with a flip-flop, as shall be seen in the second exemplary embodiment of the invention.

Figure 3:
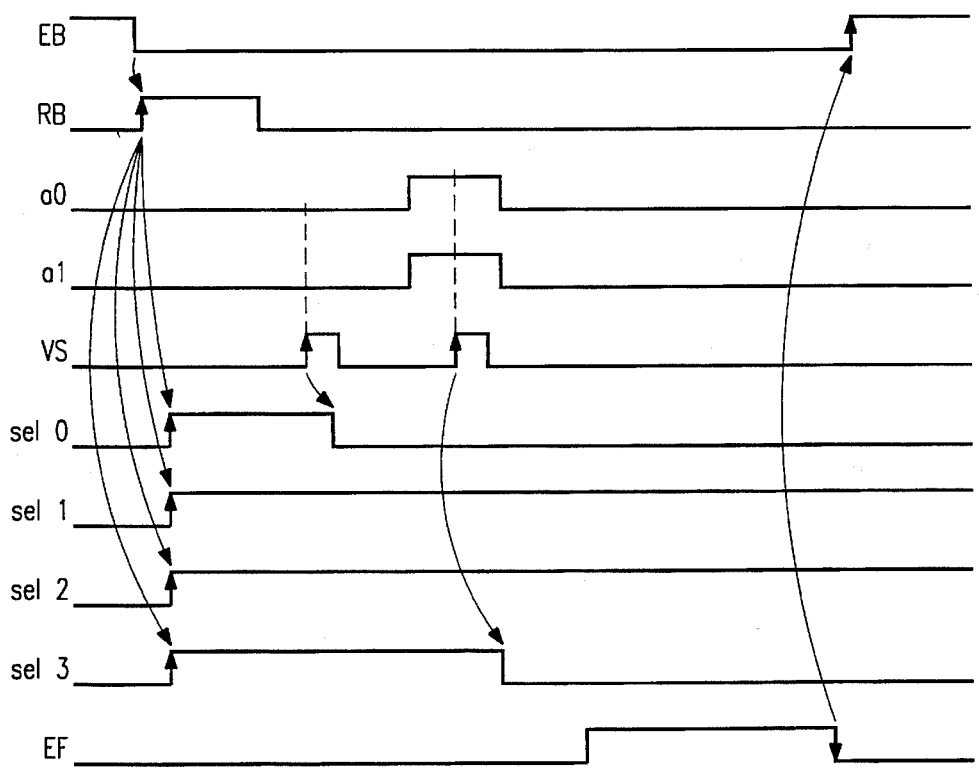
FIG. 3 is a timing diagram of the signals implemented for a block erasure according to the first embodiment of the invention.
Figure 4:
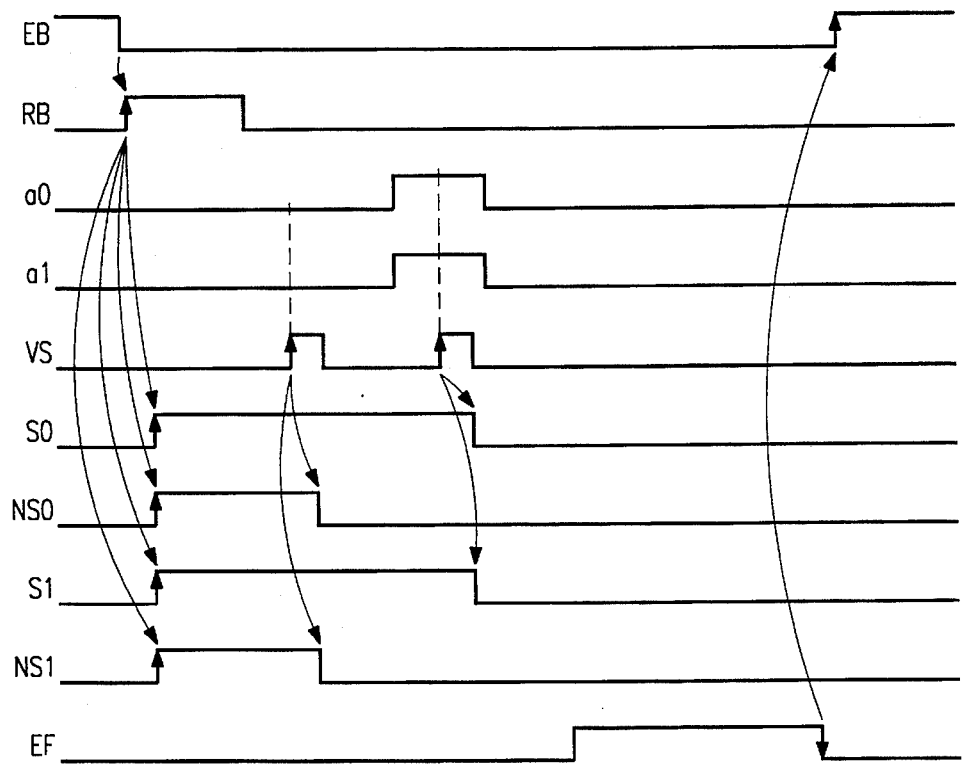
FIG. 4 is a timing diagram of the signals implemented for a block erasure according to the second embodiment of the invention.

In the invention, the clock signal CK and reset signal R are, for example, given by a selection enabling signal VS and a block reset signal RB. The signals VS and RB are, for example, active in the high-level state (FIG. 3). The selection enabling signal VS is activated after each positioning of a new address so that this new address can be memorized. In effect (FIG. 3), when an address has been positioned, for example the address 0, the corresponding selection signal, sel0, goes to the state 0. If the memorization element has been initialized beforehand (activation of the reset), and if there is an activation of the selection enabling signal (VS goes to the high-level active state in the example), then the selection sel0 is memorized, according to the above-described operation (sel0 comes to the input EMA). It is possible then to position an address, and then to activate the selection enabling signal VS, and then to position another address, etc. At each time, the selection is memorized. When all the addresses have been positioned, it is then possible to activate an erasure control signal EF (FIG. 3) which will trigger the erasure of all the word lines for which the selection has thus been memorized.

Advantageously, the memorization is used only in a particular mode of block erasure: for, it is hardly necessary to use the memorization element in reading mode for example. Thus a block erasure mode signal is available. It is, for example, the activation of this signal EB that prompts the activation of the block reset signal RB (FIG. 3) to reinitialize all the memorization elements: the outputs SMA to SMD all go to the state 1.

When the block erasure mode signal is active, it is the output of the memorization element that is used. If not, it is the input of the memorization element. In FIG. 1, lines 112, 122, 132 and 142 are indeed respectively connected to the outputs sel3, sel2, sel1 and sel0 of the NAND gates. Then, as a function of the state of the block erasure mode signal EB, a switch-over logic circuit C selects either the output of the memorization element (SMA, SMB, SMC, SMD) or its input (EMA, EMB, EMC, EMD).

This logic circuit C is a kind of switch that connects a word line, for example LM3, either to the corresponding selection signal, sel3, out of the block erasure mode, or to the memorized selection signal, SMD, in block erasure mode.

In the example of FIG. 1, for each word line, this logic circuit C consists of three logic gates: if we take the word line LM3, we thus have the logic gates C1, C2 and C3. The gate C1 is an AND gate having, as inputs, the inverted signal NEB of the block erasure mode EB, inverted by the inverter INV2, and the memorized selection output SMD. The gate C2 is an AND gate having, as inputs, the block erasure mode signal EB and the selection output sel3. The outputs C10 and C20 of the AND gates C1 and C2 are the inputs of the gate C3. The gate C3 is an OR gate and its output C30 is connected to the word line LM3.

The operation is then as follows: the state of the output C30 of the gate C3 is given by the following logic equation:

C30=sel3.EB+SMD.NEB, with EB active at the low-level state.
Thus:
in block erasure mode, EB=0 and NEB=1: C30 is the copy of SMD;
out of the block erasure mode, EB=1 and NEB=0: C30 is the copy of sel3.

In the first embodiment of the invention described, by successively positioning the addresses of the word lines to be erased, it is possible, prior to the erasure, to select a block of information formed by all the word lines, the selection of which has been memorized, then to simultaneously erase all these word lines, namely this entire block of information. There is only one erasing operation and, therefore, a great deal of time is gained as compared with prior art techniques.

FIG. 3 shows the timing diagram corresponding to the block erasure of the two word lines LM0 and LM3: the address 0 is positioned (a0=a1=0), the selection enabling signal is emitted and the corresponding selection is memorized: se10 which was at the level 1 (after the block reset activated by RB=1) goes to the level 0.

Then the address 3 is positioned (a0=a1=1), the enabling signal VS is emitted and the corresponding selection is memorized: se13 which was at the level 1 goes to the level 0.

An erasure signal EF may be emitted (FIG. 3): the lines LM0 and LM3 will be erased simultaneously. In the example of FIG. 3, the signal EF again becomes passive (level 0) at the end of the erasure, and it then makes the block erasure mode signal EB rise again. This operation is but a nonrestrictive example of the invention.

Figure 2:
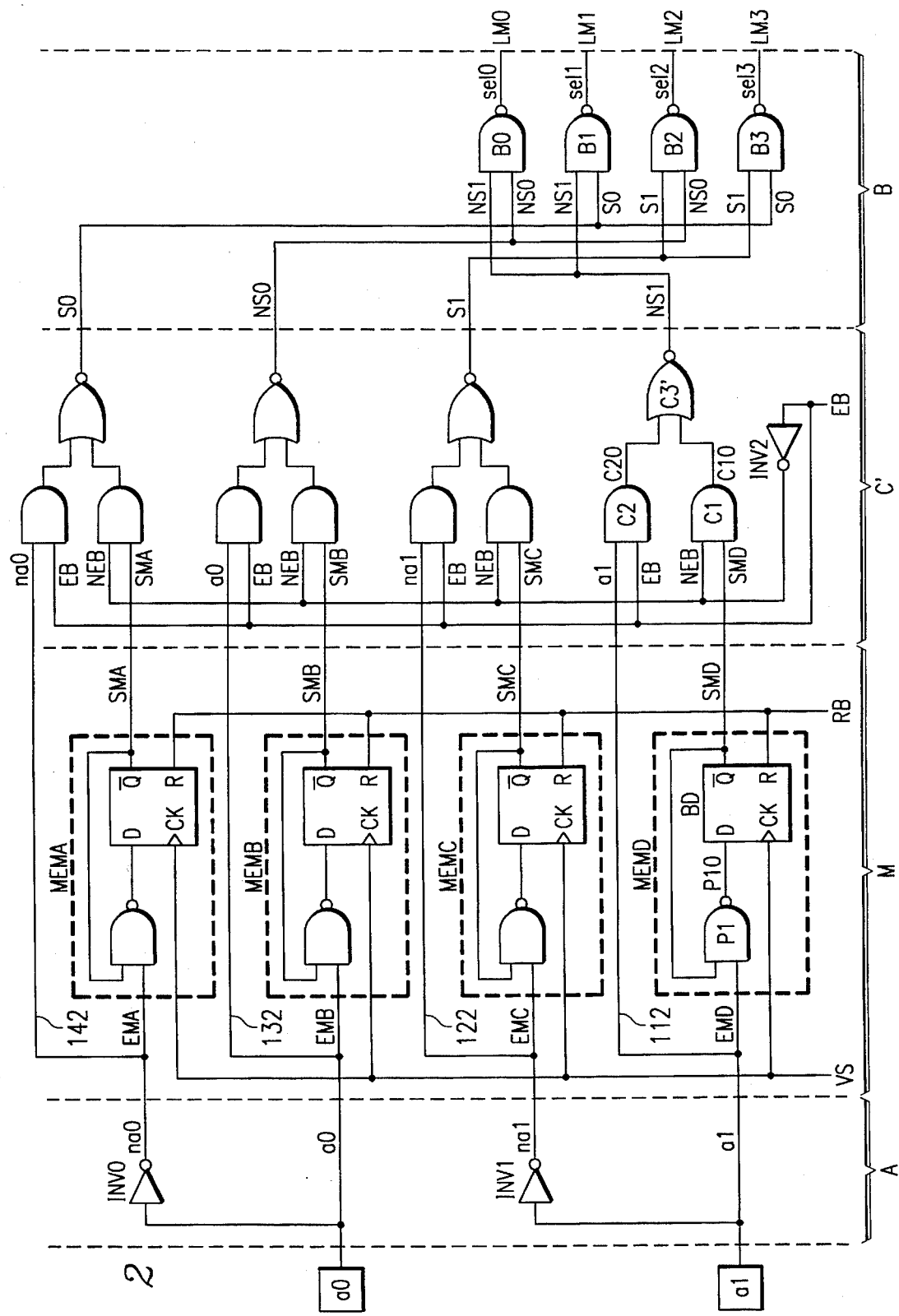
FIG. 2 is an electrical diagram of a word line decoder with a memorization element according to a second embodiment of the invention.

In a second embodiment of the invention, shown in FIG. 2, it is no longer the selection of a line word but the positioned address bits and their logic complements that are memorized: the logic circuit of the memorization is therefore located herein between a logic circuit A for the obtaining of complements of address bits and a decoding logic circuit B.

The advantage of this second embodiment, as shall be shown hereinafter, lies in the fact that it gives the user the possibility of reducing the number of addresses to be positioned to define an information block.

However, let us first describe FIG. 2. A first logic circuit A of the decoder shown has an inverter INV0, INV1 for each address bit a0, a1. These inverters make it possible to obtain the logic complements na0, na1 of the address bits a0, a1.

After the first logic circuit A, there is the already described memorization logic circuit M, with a memory element MEMA, MEMB, MEMC, MEMD for each address bit and complement, respectively na0, a0, na1, a1. The memory elements work like those of the first embodiment. This operation shall therefore not be recalled here. However, a possible constitution of a memorization element such as this is specified herein. Let us take the example of the element MEMD: its input EMD and its output SMD are the two inputs of a NAND gate, P1, the output P10 of which is the input D of a flip-flop BD. This combination makes it possible to obtain the desired operation of the memorization element with an output SMD at 1 after reset and an output SMD that changes its state (only once) upon the activation of the clock signal, if the input EMD is equal to 0, or again if the input D of the flip-flop is equal to 1.

Thus SMA equal to 0 corresponds to the memorization of na0=0, SMB equal to 0 corresponds to the memorization of a0=0, SMC equal to 0 corresponds to the memorization of na1=0 and SMD equal to 0 corresponds to the memorization of a1=0.

A switch-over logic circuit C' placed after the memorization logic circuit makes it possible, in a manner similar to the switch-over logic circuit C of the first embodiment, to avoid the use of the memorized outputs outside the block erasure mode. The only difference with the logic circuit C' is that the OR gate C3 in the logic circuit C (FIG. 1) is a NOR gate C3' in the logic circuit C' (FIG. 2). Thus: the outputs of the NOR gates of the logic circuit C', S0, NS0, S1, NS1 are:

in the block erasure mode: the inverted copies of the memory outputs SMA, SMB, SMC, SMD. They are therefore equal to 1 respectively if na0=0, a0=0, na1=0 and a1=0 have been memorized.

out of the block erasure mode: the inverted copies of, respectively, na0, a0, na1, a1. They are therefore equal to 1 respectively if na0=0, a0=0, na1=0 and a1=0 have been positioned.

S0, NS0, S1, NS1 are the inputs of the decoding logic circuit B identical to that of the first embodiment, based on NAND gates B0, B1, B2, B3. The corresponding logic equations are therefore:

se10=NAND(NS0.NS1)

se11=NAND(S0.NS1)

se12=NAND(NS0.S1)

se13=NAND(S0.S1)

se10, se11, se12, se13 are the respective outputs of the gates B0, B1, B2, B3.

a0=0 is equivalent to na0=1, and so:

--- as S0=1 corresponds to na0=0, S0=1 corresponds also to a0=1
NS0=1 corresponds to a0=0, NS0=1 corresponds also to na0=1
S1=1 corresponds to na1=0, S1=1 corresponds also to a1=1
NS1=1 corresponds to a1=0, NS1=1 corresponds also to na1=1

---

The logic equations are therefore also written as follows:

se10=NAND(na0.na1)

se11=NAND(a0.na1)

se12=NAND(na0.a1)

se13=NAND(a0.a1)

which are the logic equations already seen in the first embodiment.

If the address 0 (a0=0; a1=0) and the address 3 (a0=1; a1=1) are positioned in block erasure mode, we will therefore memorize:

a0=0 a1=0 na0=0 na1=0 which is equivalent to the decoding with:

na0=0 na1=0 a0=0 a1=0

Thus, by positioning two addresses, four of them are selected: not only LM0 (a0=0; a1=0) and LM3 (a0=1;a1=1) are selected, but also LM1 (a0=1;a1=0) and LM2 (a0=0; a1=1).

More generally, if we have four address bits, to select all the addressing having the bit with a weight 2 equal to 0, it is enough to position two addresses for all the other bits, each bit as well as its complement, to be memorized. In the example, to select all the addresses of the type:

| | |
|---|---|
| XOXX, it is enough to position: | 0000 and 1011 or |
| | 1010 and 0001 or |
| | 0011 and 1000 . . . |

There are several possible choices. In this way, and by judiciously distributing the data in the memory, it is possible to select an information block by positioning only two addresses instead of all the addresses of the word lines of the information block, as in the first embodiment.

In the case of a memory circuit, the block erasure mode EB, selection enabling VS, block reset RB and erasure EF signals may be available at the output/input pads of the memory.

If the memory is associated in one and the same integrated circuit to a processor or a sequencer of instructions, these signals could be controlled directly by the sequencer or the processor.

What is claimed is:

1. A memory circuit for an electrically erasable and programmable memory including a word line decoder, said decoder receiving address bits as inputs thereto, and said decoder comprising a first logic circuit for obtaining, for each of a plurality of selected word lines, the address bits for the respective selected word line and the logic complements of the address bits for the respective selected word line, wherein said plurality of selected word lines define a block of information, and a second logic circuit for decoding said address bits and logic complements to deliver a plurality of word line selection signals, each word line selection signal corresponding to a respective selected word line, and a memorization logic circuit connected to receive signals from said second logic circuit and accordingly to memorize information which identifies said block of information for simultaneous erasure of the corresponding word lines.

2. A memory circuit according to claim 1, wherein said memorization logic circuit is placed between said first logic circuit and said second logic circuit, and wherein said memorization logic circuit has a memorization element for each address bit and each logic complement, each address bit and each logic complement being a main input of its corresponding memorization element, so that said memorization logic circuit memorizes the address bits and the logic complements of the address bits for each of said plurality of selected word lines.

3. A memory circuit according to claim 1, wherein said memorization logic circuit is placed after said second logic circuit and wherein said memorization logic circuit has a memorization element for each word line selection signal, each word line selection signal being a main input of said corresponding memorization element, so that said memorization logic circuit memorizes said plurality of word line selection signals.

4. A memory circuit according to claim 3, wherein said memorization element has an output, a main input, a clock input and a reset input, and wherein:

upon an activation of said reset input, the output of said memorization element goes to 1, regardless of the states of said clock input and of said main input of said memorization element;

when the output of said memorization element is at the state 1, at each activation of said clock input, the state of said output of said memorization element goes to 0 if the state of said main input is at 0 and remains at 1 if the state of said main input is at 1;

and otherwise, if said output of said memorization element is at the state 0, it remains in this state for as long as there is no activation of said reset input.

5. A memory circuit according to claim 4, wherein said clock and reset inputs are controlled respectively by an enabling signal and a block reset signal common to all said memorization elements.

6. A memory circuit according to claim 4, wherein a block erasure mode signal defines a block erasure mode and wherein said second logic circuit further comprises a switchover logic circuit which provides, as output of said second logic circuit, a selection of either the main input of said memorization element, when said block erasure mode signal is inactive, or the output of said memorization element, when said block erasure mode signal is active.

7. A memory circuit according to claim 6, wherein said block reset input is activated as soon as said block erasure mode signal is activated.

8. A memory circuit according to claim 4, wherein each said memorization element includes a flip-flop, an input of which is an output of a NAND gate having, as inputs, an output of said flip-flop and the main input of said memorization element, said output of said flip-flop being the output of said memorization element.

9. A method for simultaneously erasing a block of memorized information containing a plurality of word lines in an electrically erasable and programmable memory, comprising the steps of:

supplying, for each of a plurality of selected word lines, the address bits for the respective selected word line and the logic complements of the address bits for the respective selected word line, wherein said plurality of selected word lines define a block of memorized information containing a plurality of word lines, decoding the thus supplied address bits and logic complements to deliver a plurality of word line selection signals, each word line selection signal corresponding to a respective selected word line, and memorizing data which identifies the block of memorized information which is to be erased, in response to said decoded address bits accordingly to memorize information which identifies the block of memorized information which is to be erased by a simultaneous erasure of the corresponding word lines.

10. A method in accordance with claim 9 wherein said address bits and the logic complements of the address bits for each of said plurality of selected word lines are memorized to form said memorized data.

11. A method in accordance with claim 10, wherein said step of memorizing utilizes a plurality of memorization elements corresponding in number to one memorization element for each address bit and each logic component, with each address bit and each logic complement being a main input of its corresponding memorization element, wherein each memorization element has an output, a main input, a clock input and a reset input, and wherein said step of memorizing further comprises:

causing the output of said memorization elements to go to 1 upon the activation of the reset inputs, irrespectively of the states of said clock input and of said main input of said respective memorization element;

causing, at each activation of the clock input when the output of said respective memorization element is at the state 1, the state of the output of said respective memorization element to go to 0 if the state of said respective main input is at 0 and to remain at 1 if said state of the respective main input is at 1;

if the output of said respective memorization element is at the state 0, causing it to remain in that state for as long as there is not activation of the respective reset input.

12. A method in accordance with claim 11, further comprising the steps of applying an enabling signal to the clock input of all of said memorization elements, and applying a block reset signal to the reset input of all said memorization elements.

13. A method in accordance with claim 9 wherein the step of memorizing utilizes a plurality of memorization elements corresponding in number to one memorization element for each word line selection signal, with each word line selection signal being a main input of its corresponding memorization element, wherein each memorization element has an output, a main input, a clock input and a reset input, and wherein the step of memorizing further comprises:

causing the output of said memorization elements to go to 1 upon the activation of the reset inputs, irrespectively of the states of the clock input and of the main input of said respective memorization element;

causing, at each activation of the clock input when the output of the respective memorization element is at the state 1, the state of the output of said respective memorization element to go to 0 if the state of the respective main input is at 0 and to remain at 1 if the state of said respective main input is at 1, and if the output of said respective memorization element is at the state 0, causing it to remain in that state for as long as there is not activation of the respective reset input.

14. A method in accordance with claim 13, further comprising the steps of applying an enabling signal to the clock input of all of the memorization elements, and applying a block reset signal to the reset input of all of the memorization elements.

15. An integrated circuit memory, comprising:

address decoder circuitry, connected to receive and decode a plurality of address bits and accordingly to drive a selected one of a plurality of decoded lines into an active state;

a plurality of memorization circuits, each connected to receive
a respective one of said decoded address bits,
a memorization enable signal common to all said memorization circuits, and
a reset signal common to all said memorization circuits; and each
configured to switch a respective latched output from inactive to active whenever said memorization enable signal goes active while said respective decoded line is active, and
to switch said respective latched output from active to inactive whenever said reset signal goes active; and a switch-over logic circuit, connected to receive a mode signal, and said latched outputs from said memorization circuits, and said decoded address bits, accordingly to provide either said latched outputs or said decoded address bits as wordline outputs, in accordance with the state of said mode signal.

16. The integrated circuit of claim 15, wherein each said memorization circuit includes a flip-flop and a latch.

17. The integrated circuit of claim 15, wherein each said active state corresponds to a high logic voltage.

18. The integrated circuit of claim 15, wherein said wordline outputs are operatively connected to EEPROM cells.

19. An integrated circuit memory, comprising:

a plurality of memorization circuits,
each connected to receive
a respective one of a plurality of true and complemented address bits,
a memorization enable signal common to all said memorization circuits, and
a reset signal common to all said memorization circuits; and
each configured
to provide a respective latched output, to switch said latched output from inactive to active whenever said memorization enable signal goes active while said respective address bit is active, and
to switch said latched output from active to inactive whenever said reset signal goes active;

a switch-over logic circuit, connected to receive a mode signal, said latched outputs from said memorization circuits, and said address bits, accordingly to provide either said latched outputs or said address bits as output bits, in accordance with the state of said mode signal; and address decoder circuitry, connected to receive said output bits from said switch-over logic, accordingly to simultaneously drive all selected ones of a plurality of word lines into an active state.

20. The integrated circuit of claim 19, wherein each said memorization circuit includes a flip-flop and a latch.

21. The integrated circuit of claim 19, wherein each said active state corresponds to a high logic voltage.

22. The integrated circuit of claim 19, wherein said wordline outputs are operatively connected to EEPROM cells.

23. An integrated circuit memory, comprising:

an address decoder connected to receive and decode a plurality of address bits and accordingly to drive a selected address line into an active state;

a plurality of memorization circuits,
each connected to receive a respective one of said decoded address bits, a memorization enable signal common to all said memorization circuits, and a reset signal common to all said memorization circuits; and
each connected to provide a respective latched output and to switch said latched output from inactive to active whenever said memorization enable signal goes active while said respective decoded is active, and to switch from active to inactive whenever said reset signal goes active; and switch-over logic connected to receive a mode signal, said latched outputs from said memorization circuits, and said decoded signals, accordingly to provide either said latched outputs or said decoded address bits as wordline outputs, in accordance with the state of said mode signal.

24. The integrated circuit of claim 23, wherein each said memorization circuit includes a flip-flop and a latch.

25. The integrated circuit of claim 23, wherein each said active state corresponds to a high logic voltage.

26. The integrated circuit of claim 23, wherein said wordline outputs are operatively connected to EEPROM cells.

27. A memory circuit for an electrically erasable and programmable memory including a word line decoder, said decoder receiving address bits as inputs thereto, and said decoder comprising a first logic circuit for obtaining, for each of a plurality of selected word lines, the address bits for the respective selected word line and the logic complements of the address bits for the respective selected word line, wherein said plurality of selected word lines define a block of information, and a memorization logic circuit connected to receive signals from said first logic circuit and accordingly to memorize information which identifies said block of information for simultaneous erasure of the corresponding word lines and connected to produce an output; and a second logic circuit connected to decode said address bits and logic compliments and said output of said memorization logic circuit to deliver a plurality of word line selection signals, each word line selection signal corresponding to a respective selected word line.

28. A memory circuit according to claim 27, wherein said memorization element has a main input, a clock input and a reset input, and wherein:

upon an activation of said reset input, said output of said memorization element goes to 1, regardless of the states of said clock input and of said main input of said memorization element;

when said output of said memorization element is at the state 1, at each activation of said clock input, the state of said output of said memorization element goes to 0 if the state of said main input is at 0 and remains at 1 if the state of said main input is at 1;

and otherwise, if said output of said memorization element is at the state 0, it remains in this state for as long as there is no activation of said reset input.

29. A memory circuit according to claim 28, wherein said clock and reset inputs are controlled respectively by an enabling signal and a block reset signal common to all said memorization elements.

30. A memory circuit according to claim 28, wherein a block erasure mode signal defines a block erasure mode and wherein a switch-over logic circuit selectably connects as input to said second logic circuit either the main input of said memorization element, when said block erasure mode signal is inactive, or said output of said memorization element, when said block erasure mode signal is active.

31. A memory circuit according to claim 30, wherein said block reset input is activated as soon as said block erasure mode signal is activated.

32. A memory circuit according to claim 28, wherein each said memorization element includes a flip-flop, an input of which is an output of a NAND gate having, as inputs, an output of said flip-flop and the main input of said memorization element, said output of said flip-flop being the output of said memorization element.

\* \* \* \* \*